(12) United States Patent
Oh et al.

(10) Patent No.: US 7,595,586 B2
(45) Date of Patent: Sep. 29, 2009

(54) ORGANIC ELECTROLUMINESCENT DISPLAY DEVICE

(75) Inventors: Jong-Seok Oh, Suwon-si (KR);
Yoon-Chang Kim, Suwon-si (KR);
Young-Woo Song, Suwon-si (KR);
Ji-Hoon Ahn, Suwon-si (KR);
Sang-Hwan Cho, Suwon-si (KR);
So-Young Lee, Suwon-si (KR);
Joon-Gu Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 504 days.

(21) Appl. No.: 11/289,076

(22) Filed: Nov. 29, 2005

(65) Prior Publication Data

US 2006/0113901 A1    Jun. 1, 2006

(30) Foreign Application Priority Data

Nov. 29, 2004    (KR) ...................... 10-2004-0098733

(51) Int. Cl.
*H05B 33/22* (2006.01)
(52) U.S. Cl. .................. 313/504; 313/506; 313/112
(58) Field of Classification Search .................. None
See application file for complete search history.

(56) References Cited

U.S. PATENT DOCUMENTS

| | | | | |
|---|---|---|---|---|
| 6,476,550 B1 * | 11/2002 | Oda et al. | ..................... | 313/504 |
| 6,704,335 B1 * | 3/2004 | Koyama et al. | .......... | 372/43.01 |
| 6,903,506 B2 * | 6/2005 | Kita et al. | ..................... | 313/506 |
| 7,084,565 B2 * | 8/2006 | Cho et al. | ..................... | 313/504 |

(Continued)

FOREIGN PATENT DOCUMENTS

JP    HEI 11-283751    10/1999

(Continued)

OTHER PUBLICATIONS

Notice to Submit Response by Korean Intellectual Property Office on Jun. 27, 2006.

(Continued)

*Primary Examiner*—Ashok Patel
(74) *Attorney, Agent, or Firm*—Knobbe Martens Olson & Bear LLP

(57) ABSTRACT

An organic electroluminescent display device and a method of producing the same are provided. The organic electroluminescent display device includes: a substrate; and an organic electroluminescent unit formed on a surface of the substrate and including a first electrode, an organic layer and a second electrode sequentially deposited on the substrate, in which the organic electroluminescent display device includes a diffraction grating layer having low refractive gratings and high refractive gratings alternately formed parallel to the substrate, and a high refractive layer formed on the diffraction grating layer interposed between the substrate and the first electrode. According to the organic electroluminescent display device, the light coupling efficiency can be increased due to minimized voids and unevenness generated in the formation of a diffraction grating layer, optical losses due to a first electrode can be prevented due to a high refractive layer interposed between the diffraction grating layer and the first electrode to focus light distribution on the high refractive layer, and the light coupling efficiency can be maximized due to increased light distribution in the diffraction grating layer.

19 Claims, 4 Drawing Sheets

U.S. PATENT DOCUMENTS

| | | |
|---|---|---|
| 2004/0183433 A1 | 9/2004 | Cho et al. |
| 2005/0062399 A1* | 3/2005 | Gotoh et al. ................ 313/491 |
| 2005/0116625 A1* | 6/2005 | Park et al. ................... 313/504 |

FOREIGN PATENT DOCUMENTS

| | | |
|---|---|---|
| JP | 11-307266 A | 11/1999 |
| JP | 2000-284134 A | 10/2000 |
| JP | 2002-056968 A | 2/2002 |
| KR | 2003-0070985 | 9/2003 |
| KR | 1020040079080 A | 9/2004 |

OTHER PUBLICATIONS

Office Action issued on Oct. 17, 2008 in corresponding Chinese patent application No. 200510124370.7 in 20 pages.

Office Action issued on Nov. 4, 2008 in corresponding Japanese patent application No. 2005-344359 in 3 pages.

Lu et al., Appl. Phys. Lett., vol. 78, No. 13, Mar. 26, 2001.

* cited by examiner

ORGANIC ELECTROLUMINESCENT DISPLAY DEVICE

CROSS-REFERENCE TO RELATED PATENT APPLICATION

This application claims the benefit of Korean Patent Application No. 10-2004-0098733, filed on Nov. 29, 2004, in the Korean Intellectual Property Office, the disclosure of which is incorporated herein in its entirety by reference.

BACKGROUND OF THE INVENTION

1. Field of the Invention

The present invention relates to an organic electroluminescent display device and a method of producing the same, and more particularly, to an organic electroluminescent display device having greatly improved coupling efficiency of light generated by an organic layer.

2. Description of the Related Art

Typically, organic electroluminescent display devices are self-emissive display devices that emit light by electrically exciting a fluorescent organic compound. Organic electroluminescent display devices have advantages over liquid crystal displays (LCDs) because they require a low driving voltage, have easy thin film formation properties, provide a wide viewing angle, and have fast response speeds. Therefore, there has been increasing interest in organic electroluminescent display devices as next generation displays.

Such an organic electroluminescent display device was developed as a layered-type display device by Eastman Kodak and commercialized as a green display device with an increased lifespan by Pioneer. Novel organic materials having various molecular structures have been developed and the development of color displays having beneficial properties such as low direct current driving voltage, reduced thickness and self-emission is actively taking place.

Generally, an organic electroluminescent display device is produced by forming a patterned organic layer on a transparent insulating substrate such as glass and forming electrode layers on upper and lower surfaces of the organic layer. The organic layer is composed of copper phthalocyanine (CuPc), N,N'-di(naphthalene-1-yl)-N,N'-diphenyl-benzidine (NPB) or tris-8-hydroxyquinoline aluminum.

The principle of image formation in an organic electroluminescent display device is as follows. When anode and cathode voltages are applied to electrodes, holes injected from the electrode to which the anode voltage is applied migrate to an emission layer via a hole transport layer and electrons are injected from the electrode to which the cathode voltage is applied to the emission layer via an electron transport layer. In the emission layer, the electrons and the holes are recombined to generate excitons. When the excitons are changed from an excited state to a ground state, fluorescent molecules of the emission layer emit light, thereby forming an image.

Light efficiency of the organic electroluminescent display device as described above is divided into internal efficiency and external efficiency. The internal efficiency depends on a photovoltaic conversion efficiency of an organic light emitting material and the external efficiency depends on a refractive index of each layer in the device. The external efficiency is also known as light coupling efficiency. An organic electroluminescent display device has a lower light coupling efficiency than other display devices such as CRT, PDP and FED. Thus, there is room for improvement in characteristics such as luminance, and lifespan of the organic electroluminescent display device.

FIG. 1 schematically illustrates a problem of reduction in light coupling efficiency of a conventional organic electroluminescent display device. Referring to FIG. 1 (Lu et al., APL 78 (13), p. 1927, 2001), in the conventional organic electroluminescent display device, light generated by an organic layer undergoes total internal reflection at an ITO/glass interface and a glass/air interface. In a conventional organic electroluminescent display device, the light coupling efficiency is only about 23% and the remaining light dissipates without being emitted outside.

Various methods for improving the light coupling efficiency of an organic electroluminescent display device having been proposed and, recently, methods related to introduction of a diffraction grating are studied and reported.

Japanese Patent Laid-Open Publication No. Hei 11-283751 discloses an organic electroluminescent display device including one or more organic layers interposed between an anode and a cathode, and a diffraction grating or a zone plate.

Such an organic electroluminescent display device is difficult to produce since a separate diffraction grating should be mounted on the surface of a substrate or a finely patterned electrode layer. Thus, an improvement in productivity cannot be achieved. Furthermore, when an organic layer is formed on the uneven surface of the diffraction grating, the surface roughness of the organic layer increases, resulting in a reduction in durability and reliability of the organic electroluminescent display device.

Korean Patent Laid-Open Publication No. 2003-0070985 discloses an organic electroluminescent display device having an optical loss preventing layer having regions with different refractive indices inserted between two layers with high refractive indices selected among a first electrode layer, an organic layer and a second electrode layer. Referring to FIG. 2, the diffraction grating is formed on a substrate to diffract the guided light, thereby making a diffraction angle less than the critical angle of total internal reflection so that light is emitted.

However, in such a organic electroluminescent display device, when diffused reflection is caused due to voids and unevenness generated in the formation of the diffraction grating, the quantity of light emitted to a front surface (external direction) decreases, resulting in a reduction in luminous efficiency. When a high refractive material is deposited or coated on the diffraction grating, the interface between the high refractive layer and the first electrode becomes uneven, and thus the first electrode also becomes uneven, resulting in a reduction in external light coupling efficiency.

In organic electroluminescent display devices according to the conventional art, light distribution is concentrated on the first electrode, and thus an increase in the luminous efficiency due to the diffraction grating is relatively low.

SUMMARY OF THE INVENTION

The present invention provides an organic electroluminescent display device which can improve light coupling efficiency by minimizing the generation of voids and unevenness in the formation of a diffraction grating layer, prevent optical losses due to a first electrode by including a high refractive layer interposed between the diffraction grating layer and the first electrode to focus light distribution on the high refractive layer, and maximize the light coupling efficiency by increasing light distribution in the diffraction grating layer. The present invention also provides a method of producing the organic electroluminescent display device.

According to an aspect of the present invention, there is provided An organic electroluminescent display device comprising: a substrate; and an organic electroluminescent unit formed on a surface of the substrate and comprising a first electrode, an organic layer and a second electrode, wherein the organic electroluminescent display device comprises a diffraction grating layer having low refractive gratings and high refractive gratings, and a high refractive layer formed on the diffraction grating layer interposed between the substrate and the first electrode.

According to another aspect of the present invention, there is provided a method of producing an organic electroluminescent display device, comprising: forming a high refractive film on a substrate; performing a lithographical process on the high refractive film to form high refractive gratings on the rear substrate; forming a low refractive film on the high refractive gratings; performing a lithographical process on the low refractive film to form low refractive gratings at least between the high refractive gratings, thereby forming a diffraction grating layer; and forming a high refractive layer on the diffraction grating layer; and depositing a first electrode, an organic layer and a second electrode on the high refractive layer.

According to another aspect of the present invention, there is provided a method of producing an organic electroluminescent display device, comprising: forming a low refractive film on a substrate; performing a lithographical process on the low refractive film to form low refractive gratings on the substrate; forming a high refractive film on the low refractive gratings; performing a lithographical process on the high refractive film to form high refractive gratings between the low refractive gratings, thereby forming a diffraction grating layer; forming a high refractive layer on the diffraction grating layer; and depositing a first electrode, an organic layer and a second electrode on the high refractive layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail with reference to the attached drawings.

Figure 1:
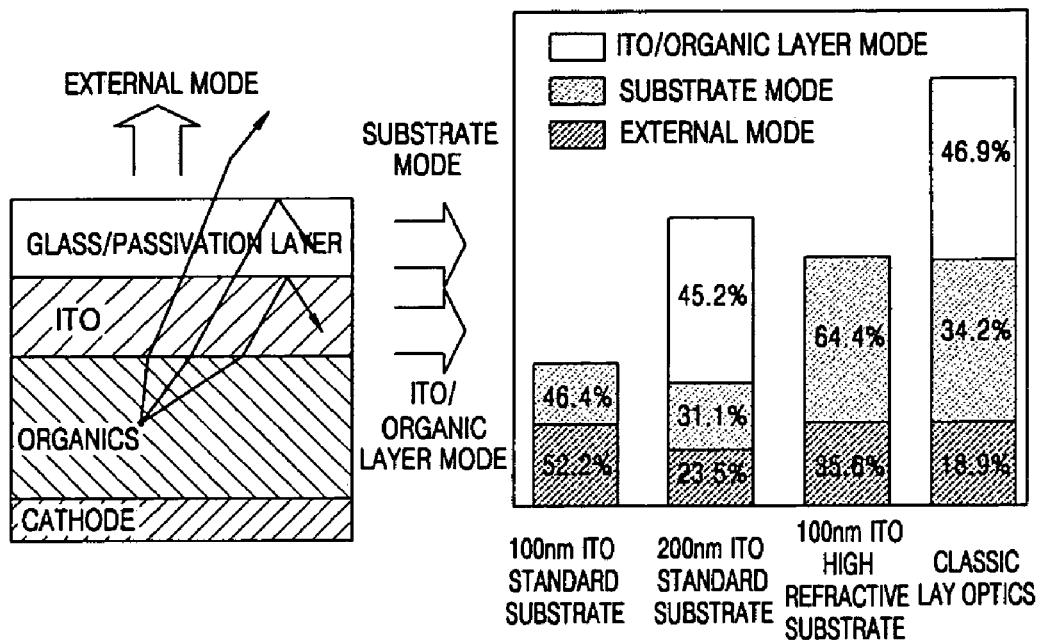
FIG. 1 schematically illustrates a problem of reduction in light coupling efficiency of a conventional organic electroluminescent display device.
Figure 2:
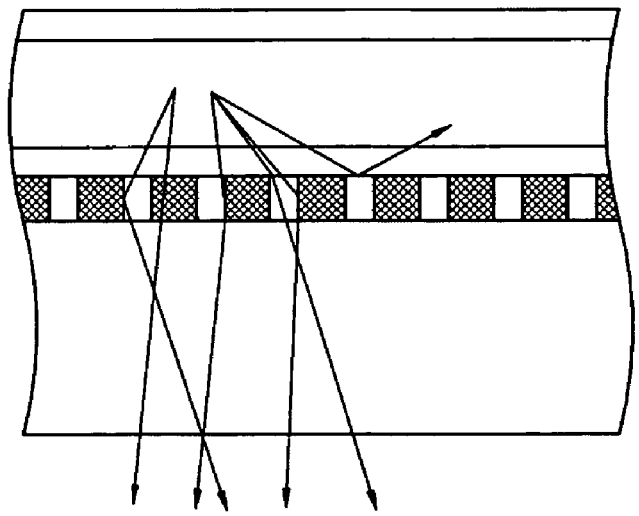
FIG. 2 is a schematic cross-sectional view of a conventional organic electroluminescent display device having a diffraction grating.
Figure 3:
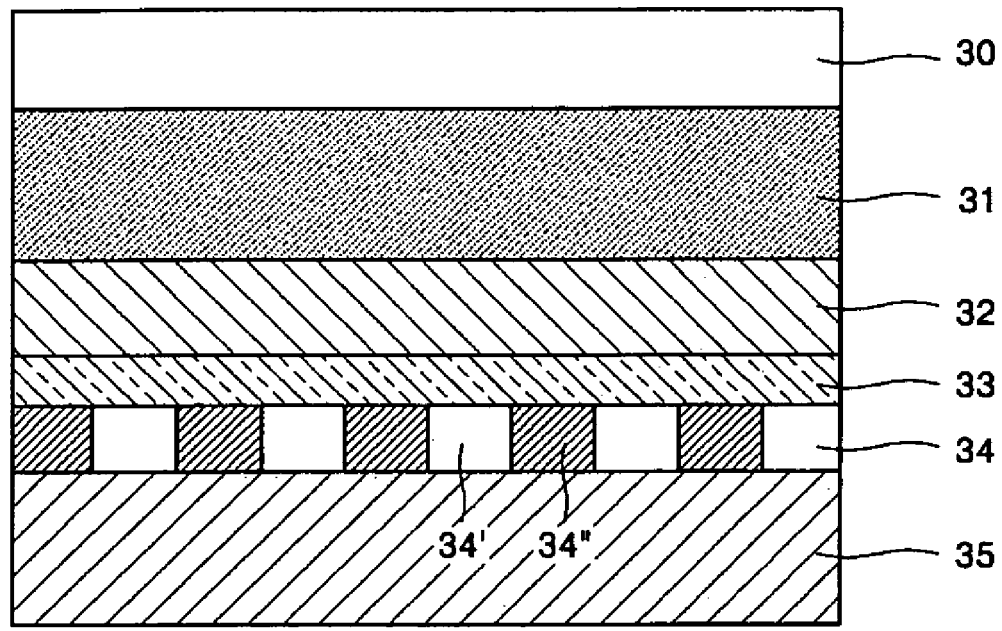
FIG. 3 is a schematic cross-sectional view of an organic electroluminescent display device according to an embodiment of the present invention.

FIG. 3 is a schematic cross-sectional view of an organic electroluminescent display device according to an embodiment of the present invention.

Referring to FIG. 3, the organic electroluminescent display device includes a first electrode 32, an organic layer 31 and a second electrode 30 which are sequentially deposited on a substrate 35 and a diffraction grating layer 34 and a high refractive layer 33 are interposed between the substrate 35 and the first electrode 32. The organic electroluminescent display device of the current embodiment can have improved light coupling efficiency due to an even surface of the diffraction grating layer 34 and the light coupling efficiency is further improved due to an increased light distribution in the diffraction grating layer 34.

The improved light coupling efficiency of the organic electroluminescent display device according to the current embodiment of the present invention is achieved as follows.

In the organic electroluminescent display device having the diffraction grating layer 34 as illustrated in FIG. 3, when a predetermined voltage is applied to either the first electrode 32 or the second electrode 30, holes injected from the first electrode 32, which is an anode, migrate to an emission layer (not shown) via a hole transport layer (not shown) in the organic layer 31 and electrons are injected from the second electrode 30 to the emission layer (not shown) via an electron transport layer (not shown) in the organic layer 31. In the emission layer, electrons and holes are recombined to generate excitons. When the excitons are changed from an excited state to a ground state, fluorescent molecules of the emission layer emit light. The generated light is emitted outside through the transparent first electrode 32 and the substrate 35. Since the diffraction grating layer 34 is formed between the substrate 35 and the first electrode 32, optical losses due to reflection at the interface of the substrate 35 and the first electrode 32 can be prevented.

That is, since the refractive index of an organic layer 31 having the emission layer or the first electrode 32 is greater than that of the substrate 35, light is reflected at the interface between the substrate 35 and the first electrode 32. However, when the diffraction grating layer 34 having high refractive gratings 34' and low refractive gratings 34" having different refractive indices is formed between the first electrode 32 and the substrate 35, reflection of light at the interface can be prevented due to diffraction of light caused by a difference in refractive index between the high refractive grating 34' and the low refractive grating 34". In particular, the diffraction grating layer 34 diffracts light irradiated to the interface at an angle greater than the critical angle to change into an angle less than the critical angle, thereby significantly reducing the reflectance of light at the interface.

Two materials having different refractive indices, i.e. the high refractive grating 34' and the low refractive grating 34" are alternately formed, and thus an average reflectance can be controlled to increase a total internal reflection angle. In this case, an anti-reflection effect is provided to significantly improve the light coupling efficiency. Thus, the coupling efficiency of light generated from the organic layer 31 and extracted through the substrate 35 can be increased.

The organic electroluminescent display device of the current embodiment of the present invention further includes the high refractive layer 33 formed on the diffraction grating layer 34. The presence of the high refractive layer 33 contributes to the improvement in the light coupling efficiency in terms of two features which are described below.

First, the organic electroluminescent display device of the current embodiment of the present invention has an improved light coupling efficiency since the high refractive layer 33 minimizes the generation of voids and unevenness inherent in a diffraction grating layer.

That is, in a conventional organic electroluminescent display device having a diffraction grating layer, when voids are generated between a high refractive grating and a low refractive grating, induced light is not completely extracted during diffraction and is scattered and reflected, resulting in a reduction in the light coupling efficiency. Thus, it is very important to form a diffraction grating layer such that a high refractive grating and a low refractive diffracting grating are close to each other without voids.

When a first electrode is formed on the high refractive grating which is uneven, it also becomes uneven due to the diffraction grating, and thus the quantity of light emitted to the front surface of the device is reduced, resulting in a reduction in the light coupling efficiency. Thus, it is very important to produce an organic electroluminescent display device having an even interface between the first electrode and the high refractive layer by solving the unevenness problem.

The present invention employs following two methods to prevent an unevenness on a first electrode. In the first method, a low refractive grating and a high refractive grating are formed so as to be of the same height using an etch-back process to form a diffraction grating layer, and then a high refractive layer is formed on the diffraction grating layer. In the second method, a film is formed on the uneven diffraction gratings using a spin coating method to produce an even surface of a high refractive layer.

Second, the organic electroluminescent display device of the current embodiment of the present invention reduces optical losses due to the first electrode 32 by focusing the light distribution on the high refractive layer 33 and increases the light coupling efficiency by increasing light distribution in the diffraction grating layer. To clearly explain this effect, light distribution charts in a conventional organic electroluminescent display device and an organic electroluminescent display device having a high refractive layer according to an embodiment of the present invention are illustrated in FIGS. 4A and 4B, respectively.

Figure 4A:
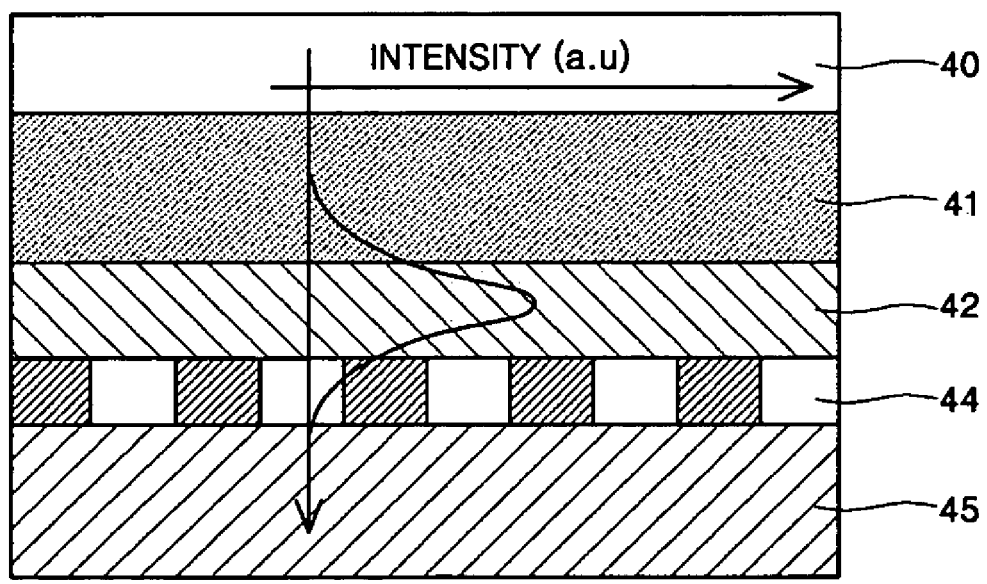
FIGS. 4A and 4B schematically illustrate light distribution of an organic electroluminescent display device having a high refractive layer interposed between a diffraction grating layer and a first electrode according to an embodiment of the present invention (4B), and that of a conventional organic electroluminescent display device without a high refractive layer (4A), respectively.
Figure 4B:
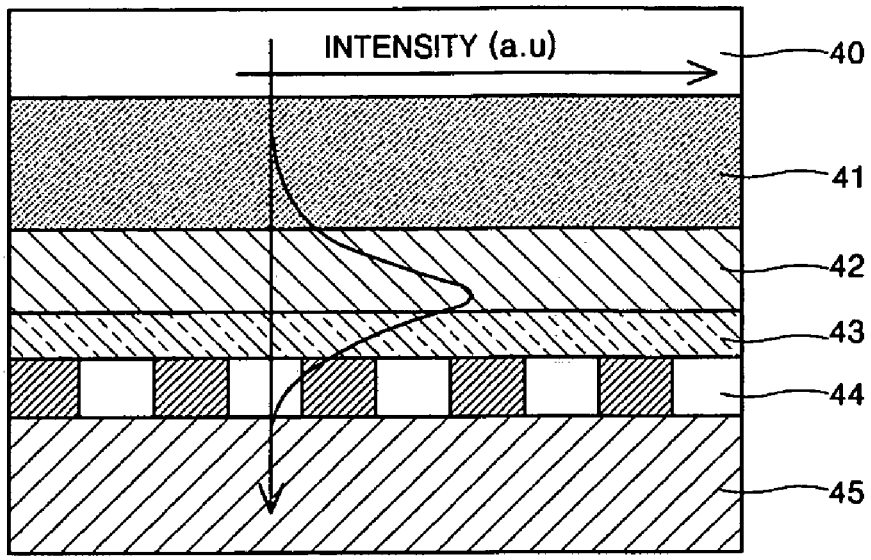

Referring to FIG. 4A, in the conventional organic electroluminescent display device, light emitted from an organic layer 41 shows the highest distribution in a first electrode 42 which generally has a high refractive index and a high absorption coefficient (for example, an ITO electrode has a refractive index of 1.8 at a wavelength of 632.8 nm and an absorption coefficient of 0.02). In this case, the light distribution in a diffraction grating layer 44 is relatively reduced, and thus the light coupling efficiency is reduced. Thus, the effect of increasing the light coupling efficiency due to the diffraction grating layer 44 cannot be sufficiently obtained.

On the contrary, in the organic electroluminescent display device according to the current embodiment of the present invention, a high refractive layer 43 having a less absorption coefficient and a greater refractive index than a first electrode 42 is interposed between the first electrode 42 and the diffraction grating layer 44, and thus light distribution is highest in the high refractive layer 43, thereby increasing the light distribution in the diffraction grating layer 44. As a result, the light coupling efficiency is increased.

Although the refractive index of a high refractive grating of the diffraction grating layer 44 is greater than that of a low refractive grating of the diffraction grating layer 44, it can be greater or less than that of the high refractive layer 43 formed on the diffraction grating layer 44. However, the refractive index of the high refractive grating should be greater than that of the first electrode 42 to obtain the maximum light distribution in the high refractive layer 43.

The diffraction grating layer 44 may have a thickness of 10 nm to 10 μm. When the thickness of the diffraction grating layer 44 is outside above range, the light coupling efficiency and producibility are reduced.

The high refractive layer 43 may have a thickness of 10 nm to 5 μm. When the thickness of the high refractive layer 43 is less than 10 nm, the evenness thereof is reduced. When the thickness of the high refractive layer 43 is greater than 5 μm, production costs and the surface tension of the high refractive layer 43 increase.

The diffraction grating layer 44 includes repeated low refractive gratings at intervals of 10 nm to 1 μm. The width of the low refractive grating may be in the range of 10-90% of the above interval, i.e., 1 nm to 900 nm. When the interval of the low refractive gratings is less than 10 nm or greater than 1 μm, light cannot be affected by the diffraction gratings, and thus improved light coupling efficiency cannot be expected. When the low refractive gratings are too wide or too narrow, the effect of improving the light coupling efficiency is significantly reduced. The refractive indices of the low refractive grating, the high refractive grating and the high refractive layer 43 may be, for example, 1.4 or less, 1.8-2.2, and 1.8-2.2, respectively, but are not limited thereto.

To maximize the light coupling efficiency, it is particularly preferable that there is a large difference between the refractive index of the high refractive grating and the refractive index of the low refractive grating. When the difference in refractive index is small, reflectance of light emitted from the organic layer 41 is increased due to low scattering efficiency in the interface between the high refractive layer and the first electrode, resulting in a reduction in the coupling efficiency of light passing though the substrate.

To satisfy the above requirements, a material for the low refractive grating may be selected from the group consisting of silicate and porous silica, a material for the high refractive grating may be selected from the group consisting of $SiN_x$, $TiO_2$, $Ta_2O_5$ and $Nb_2O_5$, and a material for the high refractive layer 43 may be $TiO_2$ sol which can be spin-coated.

The first electrode 42 is formed on a transparent substrate as an anode and may be composed of a transparent conductive material such as ITO or IZO, but is not limited thereto. Also, the first electrode 42 may comprise stripe-type electrodes. A substrate may be composed of glass or plastics.

A second electrode 40 and the organic layer 41 can be formed using methods conventionally used in the art. The organic layer 41 includes a hole injection layer, a hole transport layer, an emission layer and an electron injection layer sequentially deposited on the first electrode 42. The organic layer 41 may be composed of a low molecular weight material such as 8-hydroxyquinolino-aluminum ($Alq_3$) or a high molecular weight material such as poly (p-phenylenevinylene), poly (2-methoxy-5-(2'-ethylhexyloxy)-1,4-phenylenevinylene).

The second electrode 40 may be composed of a conductive metal and may comprise a plurality of stripe-type electrodes formed perpendicularly to the first electrode 42.

The organic electroluminescent display device according to the current embodiment of the present invention can be a top emission display, a bottom emission display, or a dual emission display. Since a driving method of the organic electroluminescent display device is not particularly limited, both a passive matrix (PM) driving method and an active matrix (AM) driving method can be used to drive the organic electroluminescent display device of the present invention.

A method of producing the organic electroluminescent display device according to an embodiment of the present invention includes: forming a high refractive film on a substrate; performing a lithographical process on the high refractive film to form high refractive gratings on the rear substrate; forming a low refractive film on the high refractive gratings; performing a lithographical process on the low refractive film to form low refractive gratings at least between the high refractive gratings, thereby forming a diffraction grating layer; and forming a high refractive layer on the diffraction grating layer; and depositing a first electrode, an organic layer and a second electrode on the high refractive layer.

Figure 5:
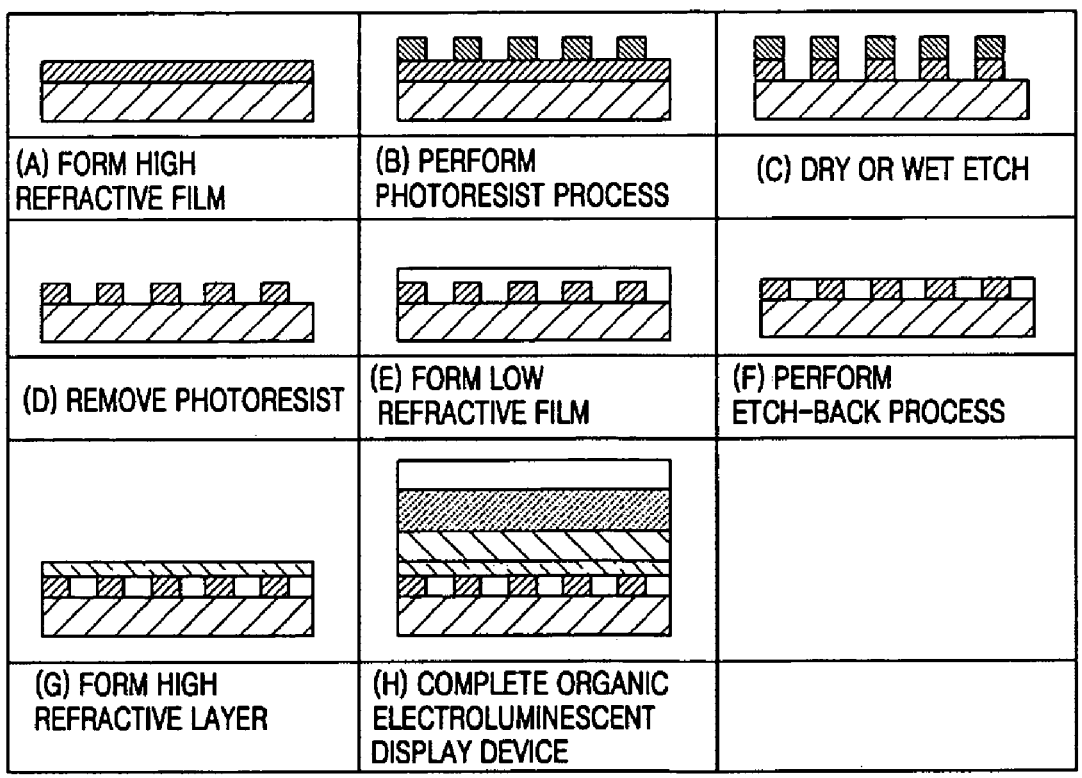
FIG. 5 schematically illustrates steps involved in a method of forming an organic electroluminescent display device according to an embodiment of the present invention.

FIG. 5 schematically illustrates steps involved in a method of forming an organic electroluminescent display device according to an embodiment of the present invention. Referring to FIG. 5, a high refractive film which can be dry or wet-etched is formed on a substrate using a depositing method, a spin coating method or the like (a). A lithographical process is performed on the high refractive film to form a regular pattern (b). Then, dry or wet-etching (c) is performed to remove the photoresist (d), thereby forming high refractive gratings. Subsequently, a low refractive film is formed on the high refractive gratings using a depositing method, a spin coating method or the like (e). A lithographical process is performed on the low refractive film to form low refractive gratings between the high refractive gratings.

A composition used in the lithographical process may be any composition conventionally used in the art. For example, a photosensitive polycarbonate resin can be used to cause pyrolysis. The pyrolysis of the photosensitive polycarbonate resin is performed at 200-500° C. for 30 minutes to 3 hours.

Preferably, the formation of low refractive gratings is performed using an etch-back process to allow the high refractive gratings and the low refractive gratings have the same height (f). Since high refractive gratings and low refractive gratings in a diffraction grating layer have the same height, the interface between the high refractive layer formed on the diffraction grating layer and a subsequently formed first electrode can have even surfaces. As a result, unevenness of the first electrode can be reduced, and thus light coupling efficiency can be increased.

After forming the diffraction grating layer, a high refractive layer is formed on the diffraction grating layer using a depositing process or a spin coating process (g). The first electrode, an organic layer and a second electrode are sequentially deposited on the high refractive layer (h), and then a sealing layer is formed thereon. Next, a substrate and a front substrate are attached to complete the organic electroluminescent display device.

A method of producing an organic electroluminescent display device according to another embodiment of the present invention includes: forming a low refractive film on a substrate; performing a lithographical process on the low refractive film to form low refractive gratings on the substrate; forming a high refractive film on the low refractive gratings; performing a lithographical process on the high refractive film to form high refractive gratings between the low refractive gratings, thereby forming a diffraction grating layer; forming a high refractive layer on the diffraction grating layer; and depositing a first electrode, an organic layer and a second electrode on the high refractive layer.

The method of the current embodiment of the present invention is similar to the previously described method. However, the present method differs from the previous method in that the low refractive film instead of the high refractive film is first formed on the substrate, and the high refractive layer is formed on the uneven diffraction grating layer using a spin coating method instead of an etch-back process so that the interface between the high refractive layer and the first electrode is planarized.

Figure 6:
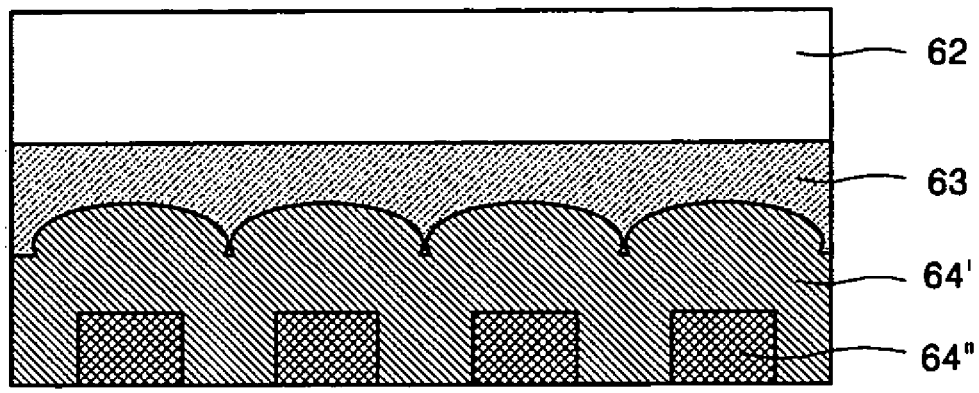
FIG. 6 is a schematic cross-sectional view of an organic electroluminescent display device according to another embodiment of the present invention.

FIG. 6 is a schematic cross-sectional view of a first electrode 62, a high refractive layer 63, and a diffraction grating layer including a high refractive grating 64' and a low refractive grating 64" in an organic electroluminescent display device produced using the method of the current embodiment of the present invention. Referring to FIG. 6, although the upper surface of the high refractive grating 64' is uneven, the high refractive layer 63 is formed on the high refractive grating 64' using a spin coating method, and thus the interface between the first electrode 62 and the high refractive layer 63 is planarized.

The low refractive film, the photoresist, the high refractive film, and the high refractive layer can be formed in the same manner as described above.

The present invention will now be described in greater detail with reference to the following examples. The following examples are for illustrative purposes only and are not intended to limit the scope of the invention.

EXAMPLE

Production of Organic Electroluminescent Display Device $SiN_x$ with a refractive index of 1.9, which was formed using a chemical vapor deposition (CVD) method, as a high refractive grating, a spin on glass (SOG) with a refractive index of 1.38, which was composed of porous silica and could be spin-coated, as a low refractive grating, and a SOG with a refractive index of 1.985 and an absorption coefficient of 0.000569, which was composed of $TiO_2$ sol and could be spin-coated, as a high refractive layer were used to produce an organic electroluminescent display device. The high refractive grating could also be formed using a sputtering, e-beam or thermal evaporation method. The low refractive grating SOG was spin coated, baked in a hot plate to remove a solvent, and cured in an oven at 200-400° C. under vacuum or a nitrogen atmosphere to induce a sol-gel reaction. The high refractive layer SOG material was also subjected to the above processes.

Evaluation of performance

Light coupling efficiency was measured for a conventional organic electroluminescent display device without a diffraction grating layer (Comparative Example 1), a conventional organic electroluminescent display device having a diffraction grating layer without a high refractive layer (Comparative Example 2), and the organic electroluminescent display device produced in the Example of the present invention. Green phosphor was used as a fluorescent material. The results are shown in Table 1.

TABLE 1

|  | Comparative Example 1 | Comparative Example 2 | Example |
|---|---|---|---|
| Light coupling efficiency (Cd/A) | 11.5 | 13 | 20 |
| Increase in light coupling efficiency (%) | — | 13 | 74 |

(Increase in Light Coupling Efficiency: Calculated with Reference to the Value of Comparative Example 1)

Figure 7:
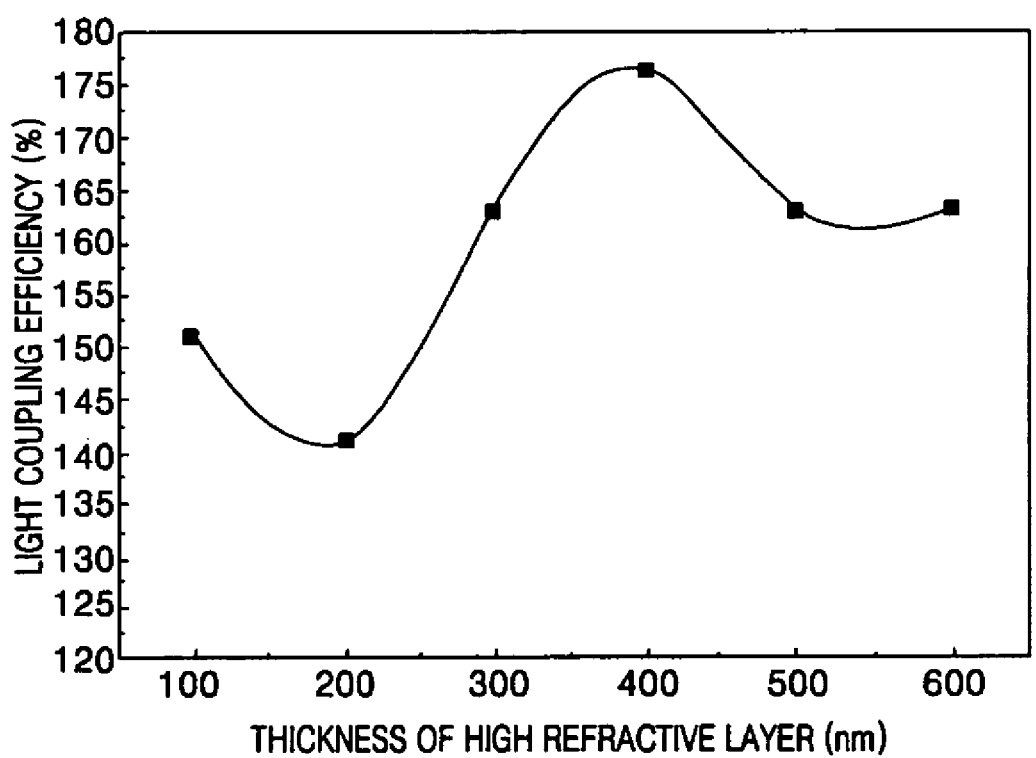
FIG. 7 is a graph illustrating the relationship between the light coupling efficiency and the thickness of a high refractive layer of an organic electroluminescent display device according to an embodiment of the present invention.

As can be seen from the results shown in Table 1, the light coupling efficiency is remarkably increased when an organic electroluminescent display device includes both a diffraction grating layer and a high refractive layer as in the present invention. Also, such results can be influenced by the structure of an organic electroluminescent display device. For example, the light coupling efficiency can be varied depending on the thickness of the high refractive layer. FIG. 7 is a graph illustrating the relationship between the light coupling efficiency and the thickness of a high refractive layer of an organic electroluminescent display device according to an embodiment of the present invention. Thus, the increase in the light coupling efficiency can be maximized by selecting the optimum thickness of a material for the high refractive layer with respect to the optical property thereof.

According to the present invention, an organic electroluminescent display device which can increase the light coupling efficiency by minimizing the generation of voids and unevenness in the formation of a diffraction grating layer, prevent optical losses due to a first electrode by including a high refractive layer between the diffraction grating layer and the first electrode to focus light distribution on the high refractive layer, and maximize the light coupling efficiency by increasing light distribution in the diffraction grating layer, and a method of producing the organic electroluminescent display device can be provided.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent display device comprising:
    a substrate;
    an organic electroluminescent unit comprising a first electrode, an organic layer and a second electrode;
    a diffraction grating layer comprising low refractive gratings and high refractive gratings, wherein the low refractive gratings are solid, and
    a high refractive layer contacting the diffraction grating layer and interposed between the substrate and the first electrode, wherein the high refractive layer has a refractive index higher than a refractive index of the low refractive gratings.

2. The organic electroluminescent display device of claim 1, wherein the low refractive gratings and the high refractive gratings are alternately arranged.

3. The organic electroluminescent display device of claim 1, wherein the refractive index of the high refractive layer is greater that that of the first electrode.

4. The organic electroluminescent display device of claim 1, wherein an absorption coefficient of the high refractive layer is less than that of the first electrode.

5. The organic electroluminescent display device of claim 1, wherein a refractive index of the high refractive gratings is greater than that of the low refractive gratings and that of the high refractive layer.

6. The organic electroluminescent display device of claim 1, wherein a refractive index of the high refractive gratings is greater than that of the low refractive gratings and less than that of the high refractive layer.

7. The organic electroluminescent display device of claim 1, wherein a thickness of the diffraction grating layer is in the range of 10 nm to 10 μm.

8. The organic electroluminescent display device of claim 1, wherein a thickness of the high refractive layer is in the range of 10 nm to 5 μm.

9. The organic electroluminescent display device of claim 1, wherein the low refractive gratings are repeated at intervals of 10 nm to 1 μm.

10. The organic electroluminescent display device of claim 1, wherein a width of each of the low refractive gratings is in the range of 1 nm to 900 nm.

11. The organic electroluminescent display device of claim 1, wherein the refractive index of the low refractive gratings is 1.4 or less.

12. The organic electroluminescent display device of claim 1, wherein a refractive index of the high refractive gratings is 1.8 to 2.2.

13. The organic electroluminescent display device of claim 1, wherein the refractive index of the high refractive layer is 1.8 to 2.2.

14. The organic electroluminescent display device of claim 1, wherein the low refractive gratings comprise a material selected from the group consisting of silicate and porous silica.

15. The organic electroluminescent display device of claim 1, wherein the high refractive gratings comprise a material selected from the group consisting of silicon nitrides, $TiO_2$, $Ta_2O_5$ and $Nb_2O_5$.

16. The organic electroluminescent display device of claim 1, wherein the high refractive layer comprises $TiO_2$ sol, which can be spin coated.

17. The organic electroluminescent display device of claim 1, wherein the first electrode comprises one of ITO and IZO.

18. The organic electroluminescent display device of claim 1, wherein the substrate comprises a material selected from the group consisting of glass and plastics.

19. The organic electroluminescent display device of claim 1, wherein the high refractive layer contacts the first electrode.

* * * * *

UNITED STATES PATENT AND TRADEMARK OFFICE
CERTIFICATE OF CORRECTION

PATENT NO. : 7,595,586 B2 Page 1 of 1
APPLICATION NO. : 11/289076
DATED : September 29, 2009
INVENTOR(S) : Oh et al.

It is certified that error appears in the above-identified patent and that said Letters Patent is hereby corrected as shown below:

| Column | Line | Description of Error |
|---|---|---|
| Title Page Col. 1 (Title); item (54); | 2 | After "DEVICE" insert --AND METHOD OF PRODUCING THE SAME--. |
| 1 | 2 | After "DEVICE" insert --AND METHOD OF PRODUCING THE SAME--. |
| 10 | 6 | In Claim 3, change "that that" to --that--. |

Signed and Sealed this

Twenty-eighth Day of September, 2010

David J. Kappos
*Director of the United States Patent and Trademark Office*